United States Patent [19]
Hynecek

[11] Patent Number: 6,091,280
[45] Date of Patent: Jul. 18, 2000

[54] CMOS IMAGE SENSOR BASED ON FOUR TRANSISTOR PHOTOCELL

[75] Inventor: Jaroslav Hynecek, Richardson, Tex.

[73] Assignee: Texas Instruments Incorporated, Dallas, Tex.

[21] Appl. No.: 09/063,852

[22] Filed: Apr. 21, 1998

Related U.S. Application Data

[60] Provisional application No. 60/044,515, Apr. 21, 1997.
[51] Int. Cl.[7] .................................................. H01L 31/00
[52] U.S. Cl. ....................... 327/514; 250/200; 250/208.1
[58] Field of Search .................................. 327/514, 515; 250/200, 552, 553, 208.1, 214 A

[56] References Cited

U.S. PATENT DOCUMENTS

| | | | |
|---|---|---|---|
| 5,113,077 | 5/1992 | Shimizu et al. | 250/370.11 |
| 5,354,980 | 10/1994 | Rappoport | 250/208.1 |
| 5,572,407 | 11/1996 | Standley | 307/117 |
| 5,742,047 | 4/1998 | Buhler et al. | 250/214 R |

*Primary Examiner*—Kenneth B. Wells
*Assistant Examiner*—Hai L. Nguyen
*Attorney, Agent, or Firm*—Alan K. Stewart; Wade James Brady, III; Richard L. Donaldson

[57] ABSTRACT

An image sensing cell includes: a light sensing device 18; a first transistor 10 having a first node coupled to the light sensing device 18; a second transistor 12 having a first node coupled to a second node of the first transistor 10; a third transistor 14 having a control node coupled to the light sensing device 18; and a fourth transistor 16 having a first node coupled to a first node of the third transistor.

10 Claims, 1 Drawing Sheet

CMOS IMAGE SENSOR BASED ON FOUR TRANSISTOR PHOTOCELL

This application claims priority under 35 USC § 119 (e) (1) of provisional application number 60/044,515, filed Apr. 21, 1997.

FIELD OF THE INVENTION

This invention generally relates to image sensing devices, and more particularly relates to CMOS active pixel image sensors.

BACKGROUND OF THE INVENTION

CCD devices are complicated to manufacture due to sophisticated processing requirements and expensive high energy ion implantation equipment. A need exists for building low cost imaging devices that have high performance and that can be used in low cost systems such as digital still cameras and PC cameras.

SUMMARY OF THE INVENTION

Generally, and in one form of the invention, the image sensing cell includes: a light sensing device; a first transistor having a first node coupled to the light sensing device; a second transistor having a first node coupled to a second node of the first transistor; a third transistor having a control node coupled to the light sensing device; and a fourth transistor having a first node coupled to a first node of the third transistor.

DETAILED DESCRIPTION OF PREFERRED EMBODIMENTS

Figure 1:
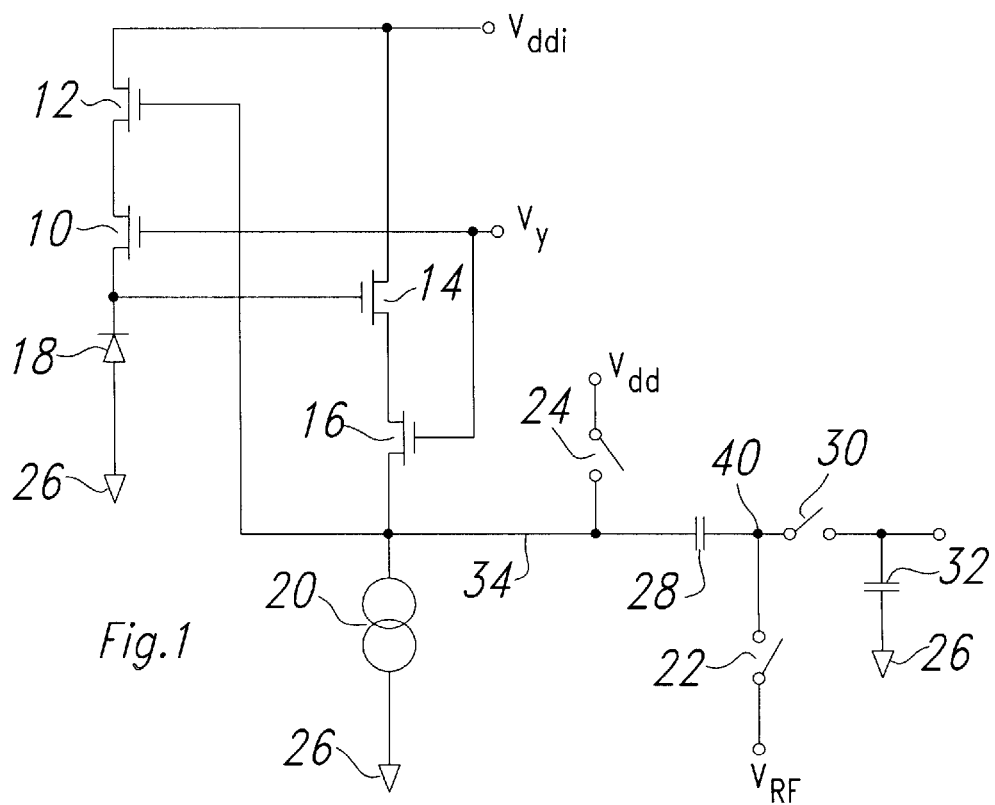
FIG. 1 is a circuit diagram of a preferred embodiment four transistor photocell.

The image sensing device consists of an array of image sensing cells which collect electrons or holes produced by impinging photons of the projected image. The preferred embodiment is a single cell of such an imaging array which can be manufactured by a standard CMOS process widely known and used in the industry.

FIG. 1 is a circuit diagram of a preferred embodiment four MOS transistor photocell. The circuit of FIG. 1 includes NMOS transistors 10, 12, 14, and 16; photodiode 18 (light sensing device); image sensor bias voltage $V_{DDi}$; reset bias voltage $V_{DD}$; Y-address (row address) voltage $V_y$; current load 20; column clamping switch 22; column reset switch 24; common node 26; column coupling capacitor 28; column sampling switch 30; column holding capacitor 32; column sense line 34; and reference voltage $V_{RF}$. Transistors 10 and 12 are formed as dual gate transistor structures. Transistors 14 and 16 are formed as dual gate transistor structures. The dual gate transistor structure has a direct connection between the corresponding transistor diffusion regions without the necessity of a metal interconnecting contact hole and a line. Similarly, the photodiode 18 can be formed as part of the first diffusion node of transistor 10.

The photocell of FIG. 1 is based on four NMOS transistors. The operation of the device begins by resetting the voltage on the photodiode 18. This is accomplished by turning the Y-address $V_Y$ high (high=$V_{dd}$) and closing the column reset switch 24. This action applies a $V_{dd}$ bias voltage to the control gate of transistor 12. Because transistors 10 and 12 now have their control gates at high bias, both are on. This resets the photodiode 18 to the $V_{ddi}$ bias. $V_{ddi}$ is usually lower than $V_{dd}$. After the column reset switch 24 is opened, the charge integration period begins. The Y-address voltage $V_Y$ to this cell is turned off and the Y-address of other array cells can be cycled. During this time interval, light of the projected image impinges on this cell and begins to discharge the photodiode 18. When the charge integration period of this cell along with all the cells connected to the same Y-address line is completed, the Y-address voltage $V_Y$ is applied again. At the same time, the clamping switch 22 is closed, which charges node 40 to the reference bias $V_{RF}$. After the clamping switch 22 is opened, the cell is reset by momentarily closing the reset switch 24. This brings the sensing cycle to its completion.

To read the photocell signal, the switch 30 is momentarily closed. With switch 30 closed, the change in the photocell output voltage caused by the reset operation is transferred through the coupling capacitor 28 to the holding capacitor 32. The clamping, resetting, and sampling operation leads to sensing of only photocell signal differences caused by the impinging light. This eliminates any offsets and biases caused by the threshold voltage variations of transistor 14. To form the video signal, a bank of holding capacitors corresponding to a column of the array is scanned. This can be accomplished by several techniques which are well known in the art.

The preferred embodiment photocell provides several advantages. One advantage is that the photocell fabrication is compatible with standard CMOS processing. Another advantage is that the transistor pair 10 and 12 and the transistor pair 14 and 16 can be fabricated as dual gate structures without metal interconnects. This makes the photocell structure small and compact. Another advantage is that the reset signal is supplied to the photocell through the same column line which is used for the signal sensing. This reduces the number of control lines which obstruct light impinging on the photocells. Another advantage is that the photocell readout technique is standard and compatible with scanning concepts well known in the art.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. For example, the photodiode 18 can be replaced by more complicated structures such as the virtual phase charge detection node described in Hynecek, *Design and Performance of a Low-Noise Charge Detection Amplifier for VPCCD Devices,* IEEE Transactions on Electron Devices, Vol. ED-31, No. 12, Dec. 1984, at 1713–1719. It is therefore intended that the appended claims encompass any such modifications or embodiments.

What is claimed is:

1. An image sensing cell comprising:

a light sensing device;

a first transistor having a first node coupled to the light sensing device;

a second transistor having a first node coupled to a second node of the first transistor;

a third transistor having a control node coupled to the light sensing device;

a fourth transistor having a first node coupled to a first node of the third transistor; and a column sense line coupled to a second node of the fourth transistor and the column sense line is coupled to a control node of the second transistor.

2. The device of claim 1 wherein the first, second, third, and fourth transistors are MOS transistors.

3. The device of claim 1 wherein the first, second, third, and fourth transistors are NMOS transistors.

4. The device of claim 1 wherein the first and second transistors are formed as a dual gate transistor structure.

5. The device of claim 1 wherein the third and fourth transistors are formed as a dual gate transistor structure.

6. The device of claim 1 further comprising a reset switch coupled to the column sense line.

7. The device of claim 1 wherein a control node of the first transistor and a control node of the fourth transistor are coupled to a row address node.

8. The device of claim 1 wherein a second node of the second transistor and a second node of the third transistor are coupled to a bias node.

9. The device of claim 1 wherein the light sensing device is a photodiode.

10. An image sensing cell comprising:

a light sensing device;

a first transistor having a first node coupled to the light sensing device;

a second transistor having a first node coupled to a second node of the first transistor;

a third transistor having a control node coupled to the light sensing device; and a fourth transistor having a first node coupled to a first node of the third transistor, wherein a control node of the first transistor and a control node of the fourth transistor are coupled to a row address node.

* * * * *